(12) United States Patent
Swanson et al.

(10) Patent No.: US 10,027,281 B2
(45) Date of Patent: Jul. 17, 2018

(54) TIME DOMAIN SWITCHED RING/DISC RESONANT GYROSCOPE

(71) Applicant: THE UNITED STATES OF AMERICA AS REPRESENTED BY THE SECRETARY OF THE NAVY, Washington, DC (US)

(72) Inventors: Paul D. Swanson, Santee, CA (US); Andrew Wang, San Diego, CA (US)

(73) Assignee: THE UNITED STATES OF AMERICA AS REPRESENTED BY THE SECRETARY OF THE NAVY, Washington, DC (US)

( * ) Notice: Subject to any disclaimer, the term of this patent is extended or adjusted under 35 U.S.C. 154(b) by 316 days.

(21) Appl. No.: 14/959,256

(22) Filed: Dec. 4, 2015

(65) Prior Publication Data

US 2016/0126890 A1     May 5, 2016

Related U.S. Application Data

(63) Continuation-in-part of application No. 13/168,603, filed on Jun. 24, 2011, now Pat. No. 9,705,450.

(51) Int. Cl.
  *H03B 5/30* (2006.01)
  *H03K 17/955* (2006.01)
  (Continued)

(52) U.S. Cl.
  CPC ........... *H03B 5/30* (2013.01); *G01C 19/5705* (2013.01); *G01P 15/097* (2013.01);
  (Continued)

(58) Field of Classification Search
  CPC ..... H03B 5/30; G01C 19/5705; G01P 15/097; G01P 15/125; G01P 15/135; H03K 17/955
  (Continued)

(56) References Cited

U.S. PATENT DOCUMENTS 3,783,601 A   1/1974 Curran
4,244,336 A   1/1981 Fitzner
(Continued)

FOREIGN PATENT DOCUMENTS

CN   101529993   9/2009
DE   102009001856   9/2010
(Continued)

OTHER PUBLICATIONS

European Patent Office Search Report, dated Mar. 18, 2016, PCT/US2013/025199.
(Continued)

*Primary Examiner* — Patrick Assouad
*Assistant Examiner* — Khristopher Yodichkas
(74) *Attorney, Agent, or Firm* — SPAWAR Systems Center Pacific; Kyle Eppele; Ryan J. Friedl

(57) ABSTRACT

A system includes a circular oscillator suspended by a flexible support structure to a support frame, a drive mechanism configured to induce the circular oscillator into a two-dimensional drive oscillation, where the drive oscillation is modified responsive to a sense oscillation of the circular oscillator caused by an angular rotation of the support frame and the circular oscillator, and a plurality of digital proximity switches disposed around a perimeter of the circular oscillator. During the modified drive oscillation a plurality of the digital proximity switches are configured to switch between an open state and a closed state and generate a time and position output to allow for a determination of each of a plurality of variable oscillation parameters for each oscillation of the modified drive oscillation.

19 Claims, 14 Drawing Sheets

(51) Int. Cl.
*G01C 19/5705* (2012.01)
*G01P 15/135* (2006.01)
*G01P 15/097* (2006.01)
*G01P 15/125* (2006.01)

(52) U.S. Cl.
CPC .......... *G01P 15/125* (2013.01); *G01P 15/135* (2013.01); *H03K 17/955* (2013.01)

(58) Field of Classification Search
USPC ...................................................... 324/76.11
See application file for complete search history.

(56) References Cited

U.S. PATENT DOCUMENTS

| | | | |
|---|---|---|---|
| 5,349,855 A | 9/1994 | Bernstein et al. | |
| 5,359,893 A | 11/1994 | Dunn | |
| 5,646,346 A | 7/1997 | Okada | |
| 5,962,845 A | 10/1999 | Yee | |
| 6,050,393 A | 4/2000 | Murai | |
| 6,838,806 B2 | 1/2005 | Chau et al. | |
| 7,591,201 B1 | 9/2009 | Bernstein | |
| 7,668,153 B2 | 2/2010 | Zavadsky | |
| 7,750,746 B2 | 7/2010 | Onuma | |
| 8,011,246 B2 | 9/2011 | Stewart | |
| 8,427,249 B1 | 4/2013 | Swanson et al. | |
| 8,448,513 B2 | 5/2013 | Lin | |
| 8,490,462 B2 | 7/2013 | Swanson et al. | |
| 8,650,955 B2 | 2/2014 | Swanson et al. | |
| 8,683,862 B2 | 4/2014 | Wang et al. | |
| 8,875,576 B2 | 11/2014 | Swanson et al. | |
| 8,910,520 B2 | 12/2014 | Jeanroy | |
| 8,991,247 B2 | 3/2015 | Trusov et al. | |
| 8,991,250 B2 | 3/2015 | Waters et al. | |
| 9,103,673 B2 | 8/2015 | Swanson et al. | |
| 9,128,496 B2 | 9/2015 | Waters et al. | |
| 9,157,814 B2 | 10/2015 | Swanson et al. | |
| 2001/0022486 A1 | 9/2001 | Shibatani | |
| 2005/0081633 A1* | 4/2005 | Nasiri | G01C 19/5712 73/514.29 |
| 2006/0062420 A1 | 3/2006 | Araki | |
| 2006/0196253 A1 | 9/2006 | Crawley et al. | |
| 2008/0223138 A1 | 9/2008 | Kurihara | |
| 2009/0071247 A1 | 3/2009 | Konaka | |
| 2009/0085683 A1 | 4/2009 | Morita et al. | |
| 2009/0206953 A1 | 8/2009 | Pavlov | |
| 2010/0103493 A1 | 4/2010 | Ide et al. | |
| 2010/0116630 A1 | 5/2010 | Pinkerton | |
| 2010/0132463 A1 | 6/2010 | Caminada et al. | |
| 2010/0207584 A1 | 8/2010 | Spartano | |
| 2010/0271314 A1 | 10/2010 | Rofougaran | |
| 2011/0041601 A1* | 2/2011 | Hsu | G01C 19/5712 73/504.08 |
| 2011/0084771 A1 | 4/2011 | Nagaraj et al. | |
| 2012/0090393 A1* | 4/2012 | Montanya Silvestre | G01P 15/00 73/514.18 |
| 2012/0111113 A1* | 5/2012 | Sammoura | G01C 19/5698 73/514.01 |
| 2016/0299873 A1 | 10/2016 | Tally et al. | |

FOREIGN PATENT DOCUMENTS

| | | |
|---|---|---|
| EP | 2360448 | 8/2011 |
| EP | 2696169 | 12/2014 |
| JP | 2009250929 | 9/1997 |
| JP | 2000500870 | 1/2000 |
| JP | 2000055670 | 2/2000 |
| JP | 2008224509 | 9/2008 |
| JP | 2009210324 | 9/2009 |
| JP | 2010169532 | 8/2010 |
| TW | 1269520 | 12/2006 |

OTHER PUBLICATIONS

Office Action, dated Sep. 7, 2016, U.S. Appl. No. 13/168,603.
Office Action, dated Oct. 20, 2016, U.S. Appl. No. 13/847,521.

* cited by examiner

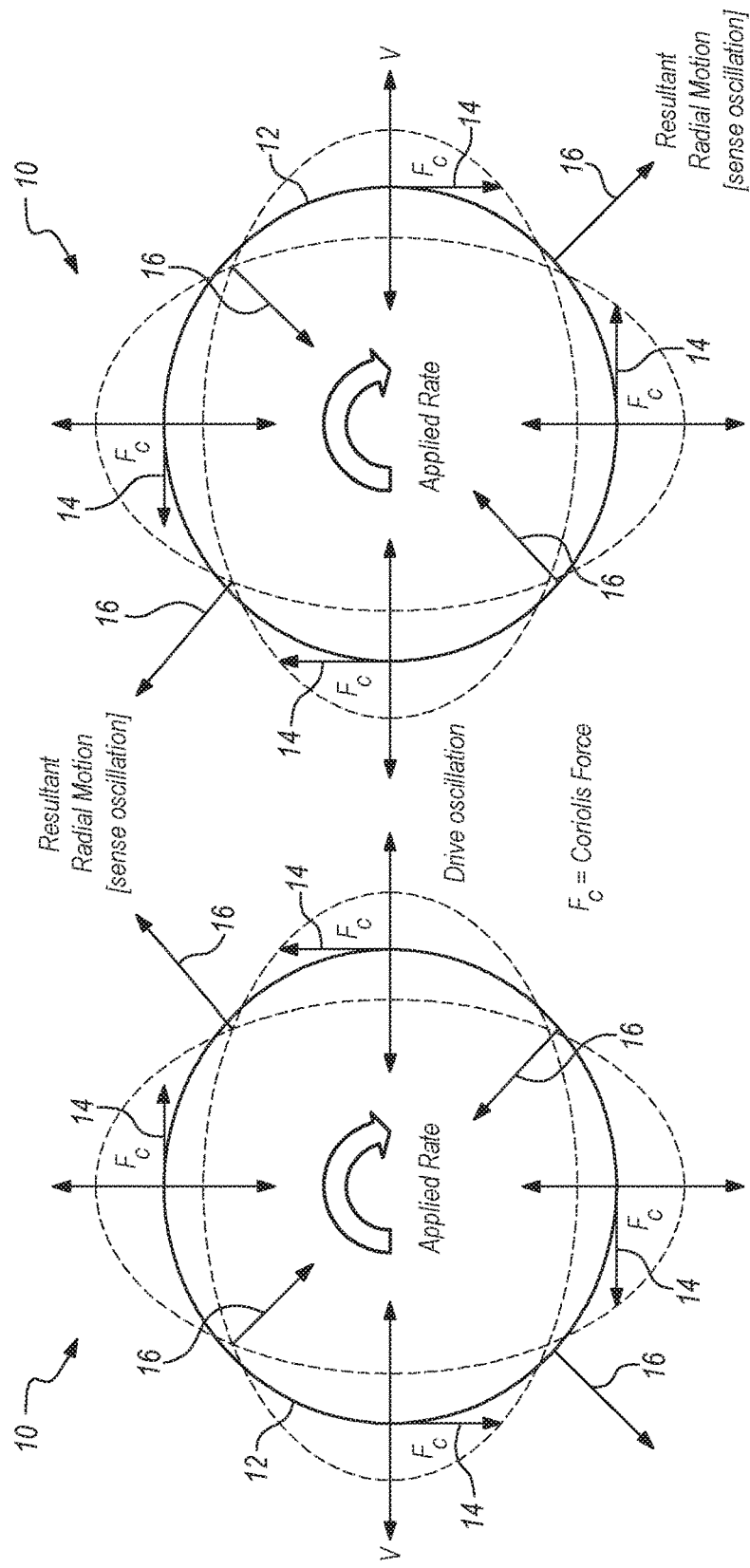

US 10,027,281 B2

TIME DOMAIN SWITCHED RING/DISC RESONANT GYROSCOPE

CROSS-REFERENCES TO RELATED APPLICATIONS

This application is a continuation-in-part of commonly-assigned U.S. patent application Ser. No. 13/168,603 filed Jun. 24, 2011, entitled "Apparatus and Methods for Time Domain Measurement of Oscillation Perturbations", the content of which is fully incorporated by reference herein.

FEDERALLY SPONSORED RESEARCH AND DEVELOPMENT

The Time Domain Switched Ring/Disc Resonant Gyroscope is assigned to the United States Government. Licensing inquiries may be directed to Office of Research and Technical Applications, Space and Naval Warfare Systems Center, Pacific, Code 72120, San Diego, Calif., 92152; telephone (619) 553-5118; email: ssc_pac_t2@navy.mil. Reference Navy Case No. 103505.

BACKGROUND OF THE INVENTION

Previous MEMS-based gyroscopes are based on capacitance measurements. Accordingly, parasitic capacitance has prevented the devices from realizing their predicted performance level. More accurate gyroscopes require significant control electronics for operation. A need exists for a small, inexpensive, low-power, circular gyroscope that is accurate to navigational grade and does not require calibration prior to use.

BRIEF DESCRIPTION OF THE DRAWINGS

FIGS. 1A and 1B show diagrams illustrating the vibrating drive oscillation of a ring/disk resonant gyroscope and the resulting forces that generate the sense mode.

DETAILED DESCRIPTION OF SOME EMBODIMENTS

Figure 2A:
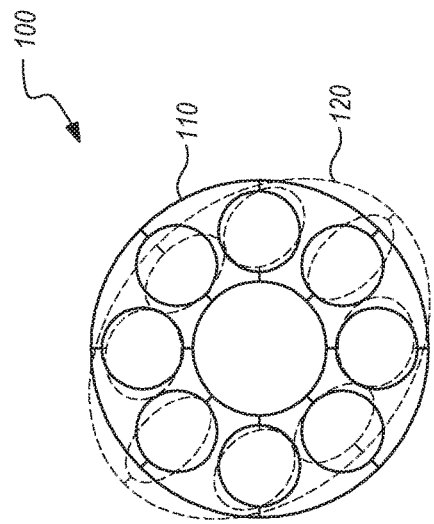
FIGS. 2A and 2B show diagrams illustrating the isolated drive and sense oscillations of an embodiment of a ring/disk resonant gyroscope in accordance with the Time Domain Switched Ring/Disc Resonant Gyroscope.

Reference in the specification to "one embodiment" or to "an embodiment" means that a particular element, feature, structure, or characteristic described in connection with the embodiments is included in at least one embodiment. The appearances of the phrases "in one embodiment", "in some embodiments", and "in other embodiments" in various places in the specification are not necessarily all referring to the same embodiment or the same set of embodiments.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or.

Additionally, use of the "a" or "an" are employed to describe elements and components of the embodiments herein. This is done merely for convenience and to give a general sense of the invention. This detailed description should be read to include one or at least one and the singular also includes the plural unless it is obviously meant otherwise.

The embodiments disclosed herein relate to a time domain switched inertial sensor technology that provides for a more accurate determination of the perturbation of a disc/ring/hemisphere resonator gyroscope caused by rotational velocity and by external linear accelerations. The technology allows for a more accurate measurement of rotational velocity (normal to the device plane) and linear accelerations (within the device plane).

Conventional ring/disc gyroscopes use capacitance to measure the distance the edge of the ring/disc has moved from its circular rest position. A time domain switched disc or ring gyroscope, as disclosed herein, uses proximity switches to determine when edge of the disc or ring has passed a known distance from its rest position and uses the harmonic oscillator equations to derive the ratio between drive and sense modes. The same time interval measurements can be used to determine and separate perturbations due to external accelerations in the plane of the gyroscope.

Advances in precision clocks and in the ability of time to digital converters (TDC)'s to measure time intervals with near pico-seconds accuracy has allowed a paradigm shift in how inertial forces can be measured. Instead of capacitively measuring distances of perturbations caused by an inertial force, time intervals are measured between triggers when a resonating structure passes known, fixed locations. In the case of a ring/disk resonant gyroscope, the shift in the direction of oscillation caused by a rotational velocity can be determined by the time interval between the triggering of proximity switches placed symmetrically on either side of the unperturbed driven vibration of the resonator. This creates a gyroscope with purely digital input (driving force) and output (interval triggering events). Such a device is not subject to electronic noise since the output is a digital trigger.

Once the fixed trigger switch locations are determined for a given device, no further calibration is required for the lifetime of the device, since the spring constant and oscillation amplitude is continuously measured. The output of the device is a digital trigger that goes directly to a FPGA. The FPGA, using a TDC and an external clock, can determine the time intervals to near pico-seconds accuracy. The calculation to derive the rate of rotation from the time intervals involves the sum of the square of time intervals divided by the sum of the square of time intervals made using the same clock, so errors in the accuracy of the clock are canceled out. The calculation requires no adjustable parameters that require continual calibration.

A disc or ring gyroscope operates by driving an oval oscillation of the ring or disc in the plane of the ring and measuring perturbations of the oscillation caused by Coriolis forces created by an external rotation. FIGS. 1A and 1B show diagrams 10 illustrating the vibrating drive oscillation of a ring/disk resonant gyroscope 12. As shown, the arrows 14 represent Coriolis forces caused by the oscillation in the presence of the rotation of the system and arrows 16 represent the resultant radial motion (sense oscillation).

The equation for the motion of the outer edge of such a vibrating hemisphere, disc or ring is given by the equation of an ellipse with the major and minor axis oscillating 180° out of phase around a fixed radius:

$$\frac{[(x-X_o)\cos(\Delta)+(y-Y_o)\sin(\Delta)]^2}{\left[R+A\cos\left(\frac{2\pi t}{P}\right)e^{-\alpha t}\right]^2} + \frac{[(x-X_o)\sin(\Delta)-(y-Y_o)\cos(\Delta)]^2}{\left[R-A\cos\left(\frac{2\pi t}{P}\right)e^{-\alpha t}\right]^2} = 1, \quad \text{Eq. 1}$$

where $X_o$ and $Y_o$ are the x and y offset of the center of the ring and $\Delta$ being the rotation of the oscillation from the main axes; With P being the oscillation period, R being the at-rest outer radius of the ring, x and y being the location of the oscillating outer perimeter of the ring at time t. A is the amplitude (maximum displacement) of the oscillation. The damping of the oscillation is caused by the Q of the system where $Q=\pi/(\alpha P)$. The rotation $\Delta$ is caused by a system rotation interacting with the current (drive) oscillation, causing a Coriolis force to squeeze the ring causing an oscillation at 45° to the current oscillation. The new drive oscillation is the summation of the original drive oscillation and the resulting "sense" oscillation.

The phenomenon that enables the use of hemispherical, disc, ring, and other structurally similar gyroscopes to sense rotation is based on the coupling of degenerate normal modes that are coupled via the Coriolis force. Ring gyroscopes, and more generally the aforementioned structures, are capable of oscillating in a variety of modes, including rigid body, extensional, and torsional, but the particular mode of oscillation that is used for precession detection is the first flexural mode of oscillation. Due to this mode of oscillation being degenerate, at a single natural frequency of the ring, multiple modes exist. They are shown below and can be easily written in polar coordinates.

$$\Phi_1(\theta)=\cos 2\theta$$

$$\Phi_2(\theta)=\sin 2\theta \quad \text{Eq. 2}$$

It should be noted that in practice, slight fabrication imperfections may exist which both can cause the degenerate natural frequency to split into two distinct frequencies and rotate the modes. Assuming that the initial conditions of the system are such that higher-order modes are not excited, one can describe the position of the ring using the modal coordinates of the system. That is, $$r(\theta,t)=r_0+q_1(t)\Phi_1(\theta)+q_2(t)\Phi_2(\theta) \quad \text{Eq. 3}$$

Assuming free vibrations (i.e. unforced oscillations) and rescaling the system parameters to ones that are more easily quantified, the dynamics of the modal coordinates are given from $$\ddot{q}_1+2\alpha_{11}\dot{q}_1+2\alpha_{12}\dot{q}_2-2A_g\Omega\dot{q}_2-2A_g\dot{\Omega}q_2+K_1q_1+\omega_1^2q_1=0$$

$$\ddot{q}_2+2\alpha_{21}\dot{q}_1+2\alpha_{22}\dot{q}_2+2A_g\Omega\dot{q}_1+2A_g\dot{\Omega}q_1+K_2q_2+\omega_2^2q_1=0 \quad \text{Eq. 4}$$

where $A_g$ is the angular gain of the ring. Assuming that the modes are perfectly matched such that $\omega_1=\omega_2=\omega_0$, these modes are damped equally such that $\alpha_{11}=\alpha_{22}=\alpha$, asymmetric damping can be neglected such that $\alpha_{12}=\alpha_{21}=0$, effects associated with angular acceleration can be neglected such that $\dot{\Omega}=0$, and centrifugal stiffness is insignificant such that $K_1=K_2=0$, $$\ddot{q}_1+2\alpha\dot{q}_1-2A_g\Omega\dot{q}_2+\omega_0^2q_1=0$$

$$\ddot{q}_2+2\alpha\dot{q}_2+2A_g\Omega\dot{q}_1+\omega_0^2q_2=0 \quad \text{Eq. 5}$$

In order to solve this system of differential equations, let $q=q_1+iq_2$. It can then be shown the solution to $$\ddot{q}+2\alpha\dot{q}-2iA_g\Omega\dot{q}+\omega_0^2q=0 \quad \text{Eq. 6}$$

can be used to determine the values for the modal coordinates. In order to reduce the number of parameters that can influence the response, time can be rescaled such that $\tau=\omega_0 t$. This allows one the write $$\frac{dq}{dt}=\dot{q}=\frac{dq}{d\tau}\frac{d\tau}{dt}=\omega_0 q'$$

and the former differential equation can be written as $$q''+2\tilde{\alpha}q'+2i\tilde{\Omega}q'+q=0, \quad \text{Eq. 7}$$

where $$\tilde{\alpha} = \frac{\alpha}{\omega_0}$$

and $$\tilde{\Omega} = \frac{A_g \Omega}{\omega_0}.$$

Assuming that at time $\tau=0$, $q=1$ and $q'=0$, the solution is $$q(\tau) = e^{-\tilde{\alpha}\tau} e^{-i\tilde{\Omega}\tau} \frac{1}{\sqrt{1-(\tilde{\alpha}+i\tilde{\Omega})^2}} \cos\left(\sqrt{1-(\tilde{\alpha}+i\tilde{\Omega})^2}\,\tau - \tan^{-1}\left(\frac{\tilde{\alpha}+i\tilde{\Omega}}{\sqrt{1-(\tilde{\alpha}+i\tilde{\Omega})^2}}\right)\right) \quad \text{Eq. 8}$$

While this solution is relatively compact, it is more useful when expressed as the sum of a real and imaginary component $$q(\tau) = e^{-\tilde{\alpha}\tau} u(\tau) + i e^{-\tilde{\alpha}\tau} v(\tau) \quad \text{Eq. 9}$$

$$u(\tau) = \cos(\tilde{\Omega}\tau)(\cos(a\tau)\cosh(b\tau) + \quad \text{Eq. 10}$$
$$\beta_1 \sin(a\tau)\cosh(b\tau) - \beta_2 \cos(a\tau)\sinh(b\tau)) + \sin(\tilde{\Omega}\tau)$$
$$(-\sin(a\tau)\sinh(b\tau) + \beta_2 \sin(a\tau)\cosh(b\tau) + \beta_1 \cos(a\tau)\sinh(b\tau))$$

$$v(\tau) = \cos(\tilde{\Omega}\tau)(-\sin(a\tau)\sinh(b\tau) + \quad \text{Eq. 11}$$
$$\beta_2 \sin(a\tau)\cosh(b\tau) + \beta_1 \cos(a\tau)\sinh(b\tau)) - \sin(\tilde{\Omega}\tau)$$
$$(\cos(a\tau)\cosh(b\tau) + \beta_1 \sin(a\tau)\cosh(b\tau) - \beta_2 \cos(a\tau)\sinh(b\tau))$$

$$a + bi = \sqrt{1-(\tilde{\alpha}+i\tilde{\Omega})^2} \quad \text{Eq. 12}$$

$$a = \frac{\sqrt{(1+\tilde{\Omega}^2-\tilde{\alpha}^2) + \sqrt{4\tilde{\alpha}^2\tilde{\Omega}^2 + (1+\tilde{\Omega}^2-\tilde{\alpha}^2)^2}}}{\sqrt{2}} \quad \text{Eq. 13}$$

$$b = -\frac{\sqrt{2}\,\tilde{\alpha}\tilde{\Omega}}{\sqrt{(1+\tilde{\Omega}^2-\tilde{\alpha}^2) + \sqrt{4\tilde{\alpha}^2\tilde{\Omega}^2 + (1+\tilde{\Omega}^2-\tilde{\alpha}^2)^2}}} \quad \text{Eq. 14}$$

$$\beta_1 + \beta_2 i = \frac{\tilde{\alpha}+i\tilde{\Omega}}{\sqrt{1-(\tilde{\alpha}+i\tilde{\Omega})^2}} \quad \text{Eq. 15}$$

$$\beta_1 = \frac{a\tilde{\alpha} + b\tilde{\Omega}}{a^2 + b^2} \quad \text{Eq. 16}$$

$$\beta_2 = \frac{a\tilde{\Omega} - b\tilde{\alpha}}{a^2 + b^2} \quad \text{Eq. 17}$$

Due to the typical scaling of the systems parameters (i.e. the natural frequency of the ring is in the KHz range, the quality factor of the resonator is significantly greater than 100, and the rotation rate is less than 360°/sec), the above expressions for a, b, $\beta_1$ and $\beta_2$ can be simplified $$a \approx 1 + \frac{\tilde{\Omega}^2}{2} - \frac{\tilde{\alpha}^2}{2} - \frac{\tilde{\Omega}^4}{4} + \frac{3\tilde{\alpha}^2\tilde{\Omega}^2}{4} - \frac{\tilde{\alpha}^4}{8} \quad \text{Eq. 18}$$

$$b \approx -\tilde{\alpha}\tilde{\Omega} + \frac{\tilde{\alpha}\tilde{\Omega}^3}{2} - \frac{\tilde{\alpha}^3\tilde{\Omega}}{2} \quad \text{Eq. 19}$$

$$\beta_1 \approx \tilde{\alpha} + \frac{\tilde{\alpha}^3}{2} - \frac{3\tilde{\alpha}\tilde{\Omega}^2}{2} \quad \text{Eq. 20}$$

$$\beta_2 \approx \tilde{\Omega} - \frac{\tilde{\Omega}^3}{2} + \frac{3\tilde{\alpha}^2\tilde{\Omega}}{2} \quad \text{Eq. 21}$$

Figure 2B:
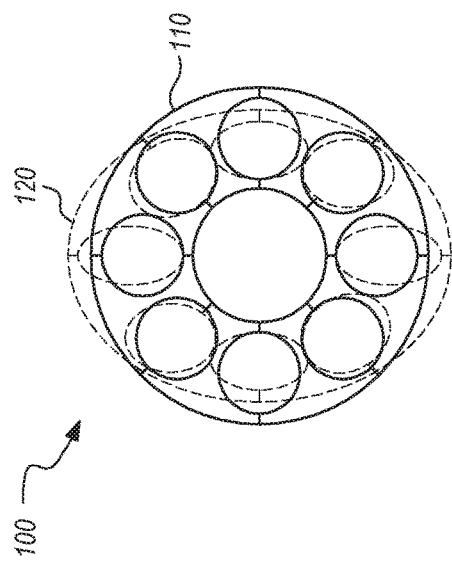

FIGS. 2A and 2B show diagrams 100 illustrating the isolated drive and sense oscillations of an embodiment of a ring/disk resonant gyroscope in accordance with the Time Domain Switched Ring/Disc Resonant Gyroscope. FIG. 2A shows a gyroscope 110, shown in more detail in FIGS. 4A and 4B, having a drive oscillation 120. FIG. 2B shows gyroscope 110 having a shifted oscillation 130 representing a combination of the drive oscillation and a sense oscillation. The addition of a smaller in-phase sense oscillation 45° from the drive oscillation causes the net oscillation to appear to rotate towards the sense oscillation. The combination of the drive mode oscillation and the sense mode oscillation will produce the same shape oscillation, only rotated by an angle dependent on the sense/drive mode amplitude ratio. By deriving the ratio of sense oscillation to the drive oscillation, the external rate of rotation can be calculated.

Figure 3:
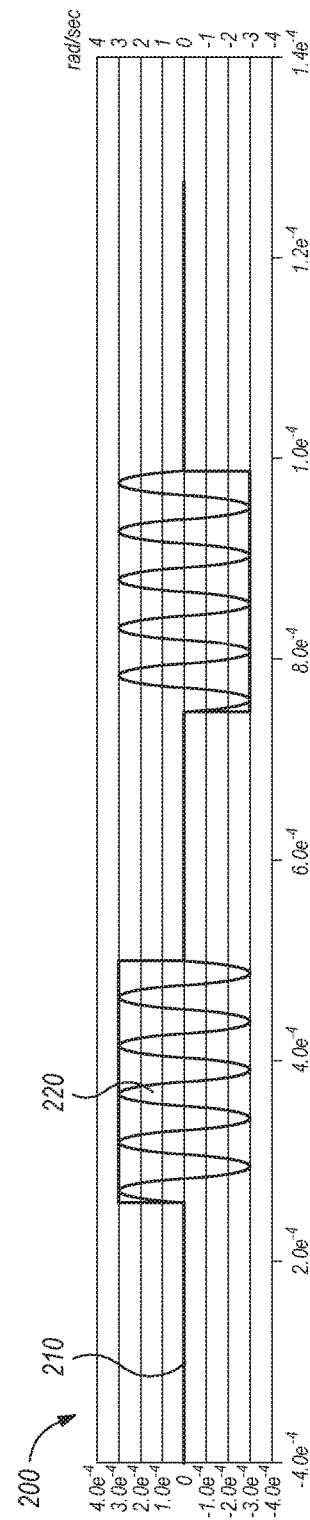
FIGS. 3-5 show diagrams illustrating a simulation of an immediate response of the sense mode to Coriolis force from two short rotations of an embodiment of a ring/disk resonant gyroscope in accordance with the Time Domain Switched Ring/Disc Resonant Gyroscope.
Figure 4:
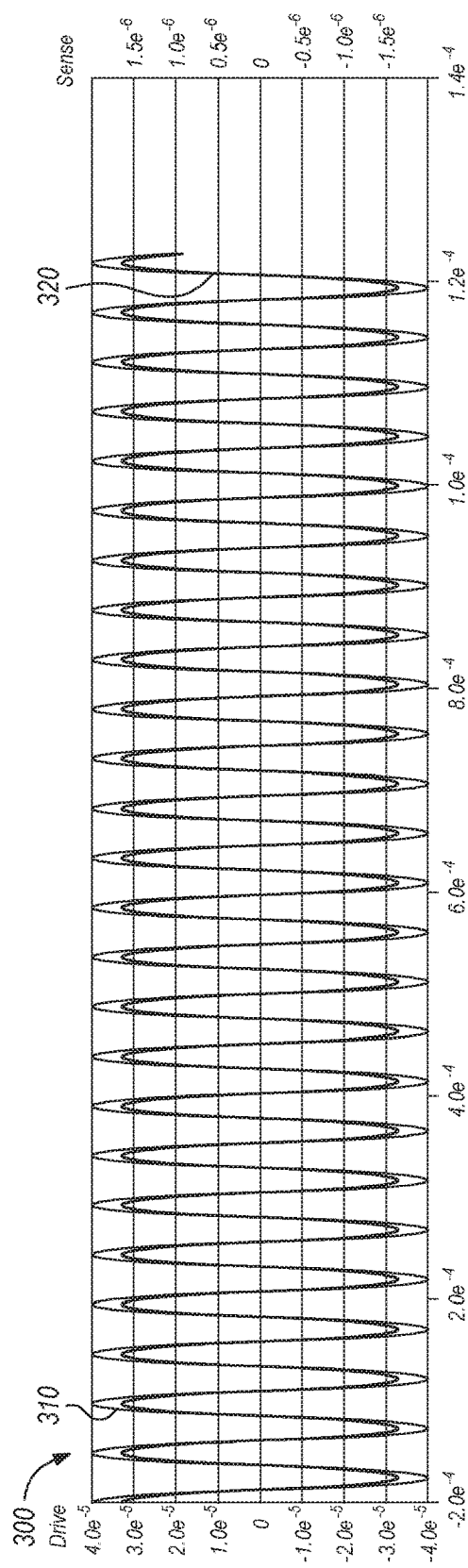
Figure 5:
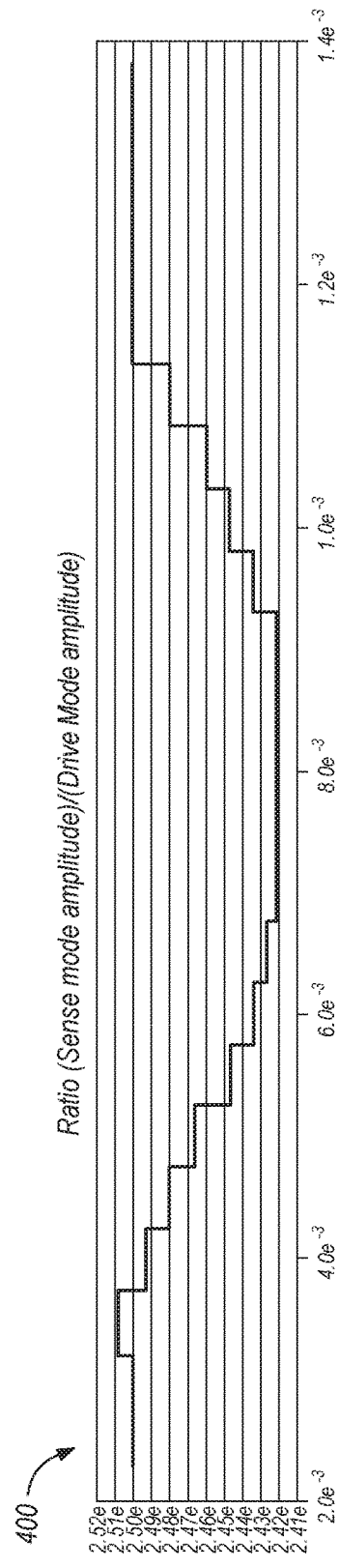

FIGS. 3-5 show diagrams illustrating a simulation of an immediate response of the sense mode to Coriolis force from two short rotations of an embodiment of a ring/disk resonant gyroscope in accordance with the Time Domain Switched Ring/Disc Resonant Gyroscope. FIG. 3 shows a diagram 200 illustrating a Coriolis force created by a rate of rotation, where line 210 represents the rate of rotation and line 220 represents the resulting sinusoidal Coriolis force. FIG. 4 shows a diagram 300 illustrating the sense oscillation separate from the drive oscillation, where line 310 represents the drive oscillation and line 320 represents the sense oscillation. FIG. 4 shows change in sense oscillation caused by the rate of rotation. FIG. 5 shows a diagram 400 illustrating shows the ratios of the sense mode versus the drive mode, the change of which is caused by the rate of rotation.

The resulting change in $\Delta$, ($\Delta_2-\Delta_1$), would be 22.5° times the ratio of the sense oscillation and drive oscillation. This ratio is given below by Eq. 22:

$$\frac{x_{sense}}{x_{drive}} = \frac{-QP}{\pi}(V_{rotation}) \quad \text{Eq. 22}$$

Eq. 22 represents the relationship between steady state sense/drive ratio and the external rate of rotation. Because the velocity $V_{drive}$ of the drive oscillation is 90° out of phase with the drive oscillation displacement $X_{drive}$, and the Coriolis force is a function of $V_{drive}$, the resulting displacement $X_{sense}$ ends up being in phase with the original $X_{drive}$, assuming the drive oscillation and sense oscillation have the same resonant frequency, where the resonant frequency $\omega=2\pi/P$. The angular gain $$A_g = \frac{(\Delta_2 - \Delta_1)}{(t_2 - t_1)V_{rotation}}$$

will give the same net vibrational mode rotation for a given actual rotation regardless of the speed of rotation. From Eq. 22, $$V_{rotation} = \frac{8(\Delta_2 - \Delta_1)}{QP} = \frac{8}{\pi}\alpha(\Delta_2 - \Delta_1), \qquad \text{Eq. 23}$$

and the angular gain $$A_g = \frac{\pi}{8\alpha(t_2 - t_1)}.$$

Figure 17:
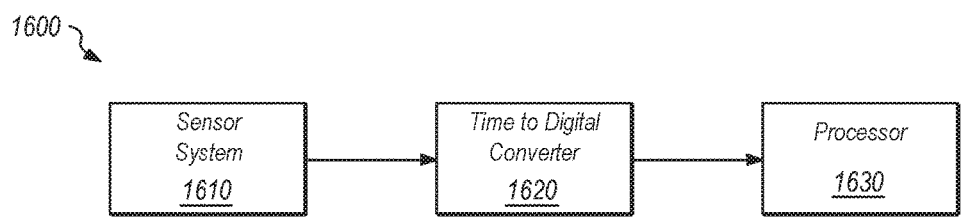
FIG. 17 shows a block diagram of an embodiment of a system in accordance with the Time Domain Switched Ring/Disc Resonant Gyroscope.

Conventional ring/disc/hemisphere gyroscopes just measure $\Delta_1 - \Delta_1$ and use a fixed $\alpha$ determined by calibration. Time domain switched (TDS) ring/disc/hemisphere gyroscopes measure $x_i$, $y_i$, and $t_i$ and solve for all variable parameters for each oscillation, including $\alpha$, so that calibration is not necessary. Since in TDS devices $x_i$, and $y_i$ are fixed, accuracy and resolution are only a function of measuring time intervals $t_i$. State of the art TDCs, such as shown in FIG. 17, have accuracies in the tens of picoseconds, making TDS devices viable as navigation grade inertial sensors. A TDC can also be programmed into a conventional FPGA, simplifying the control circuitry.

In Eq. 1, the variable parameters for a given $x_i$, $y_i$, and $t_i$ are $X_o$, $Y_o$, $\Delta$, $A$, $P$, and $\alpha$. Knowing $X_o$ and $Y_o$, linear acceleration in the X and Y directions can be measured. Knowing the oscillation period P and the relationship between the spring constant and the temperature, the operating temperature can be calculated. Knowing the current oscillation amplitude $Ae^{-\alpha t}$, a driving force can be applied when needed to maintain the oscillation. To calculate for the six unknowns, six sets of $x_i$, $y_i$, and $t_i$ are required.

Figure 6A:
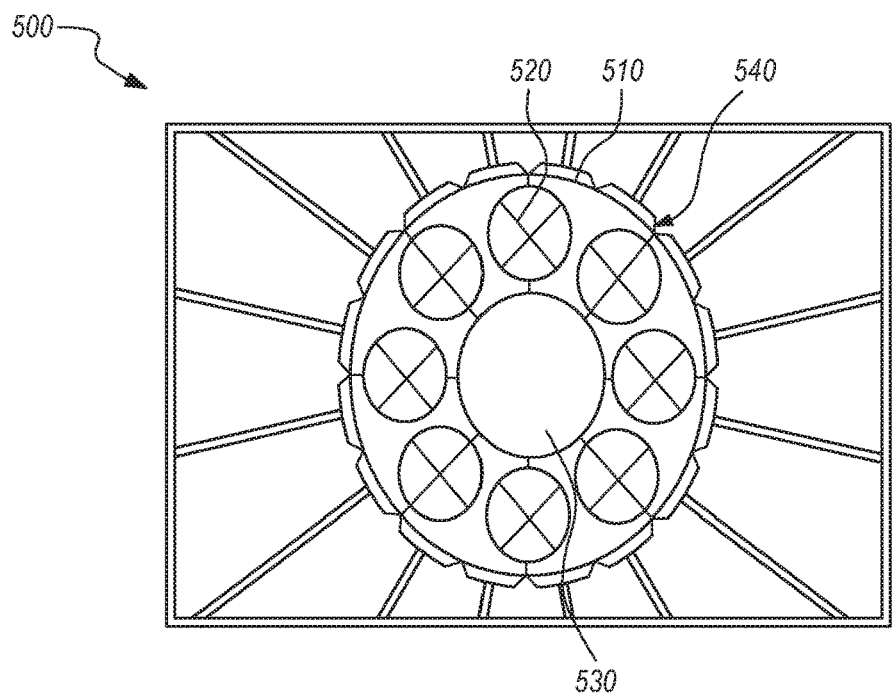
FIGS. 6A-6B show diagrams of an embodiment of a ring/disk resonant gyroscope in accordance with the Time Domain Switched Ring/Disc Resonant Gyroscope.
Figure 6B:
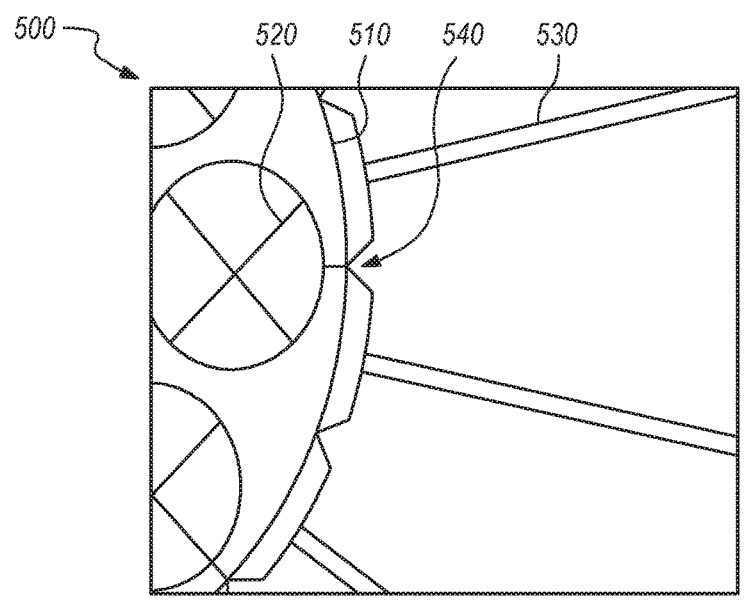

FIGS. 6A-6B show diagrams of an embodiment of a ring/disk resonant gyroscope 500 in accordance with the Time Domain Switched Ring/Disc Resonant Gyroscope. In the embodiment shown, gyroscope 500 includes a circular oscillator 510 suspended by a flexible support structure 520 to a support frame 530, with support frame 530 being located central to circular oscillator 510. As an example, circular oscillator 510 may comprise a ring, disk, or other circular oscillator that is capable of two-dimensional oscillation as would be recognized by a person having ordinary skill in the art. As shown, flexible support structure 520 includes eight springs which are disposed around an inside perimeter of circular oscillator 510 between circular oscillator 510 and support frame 530.

Figure 12A:
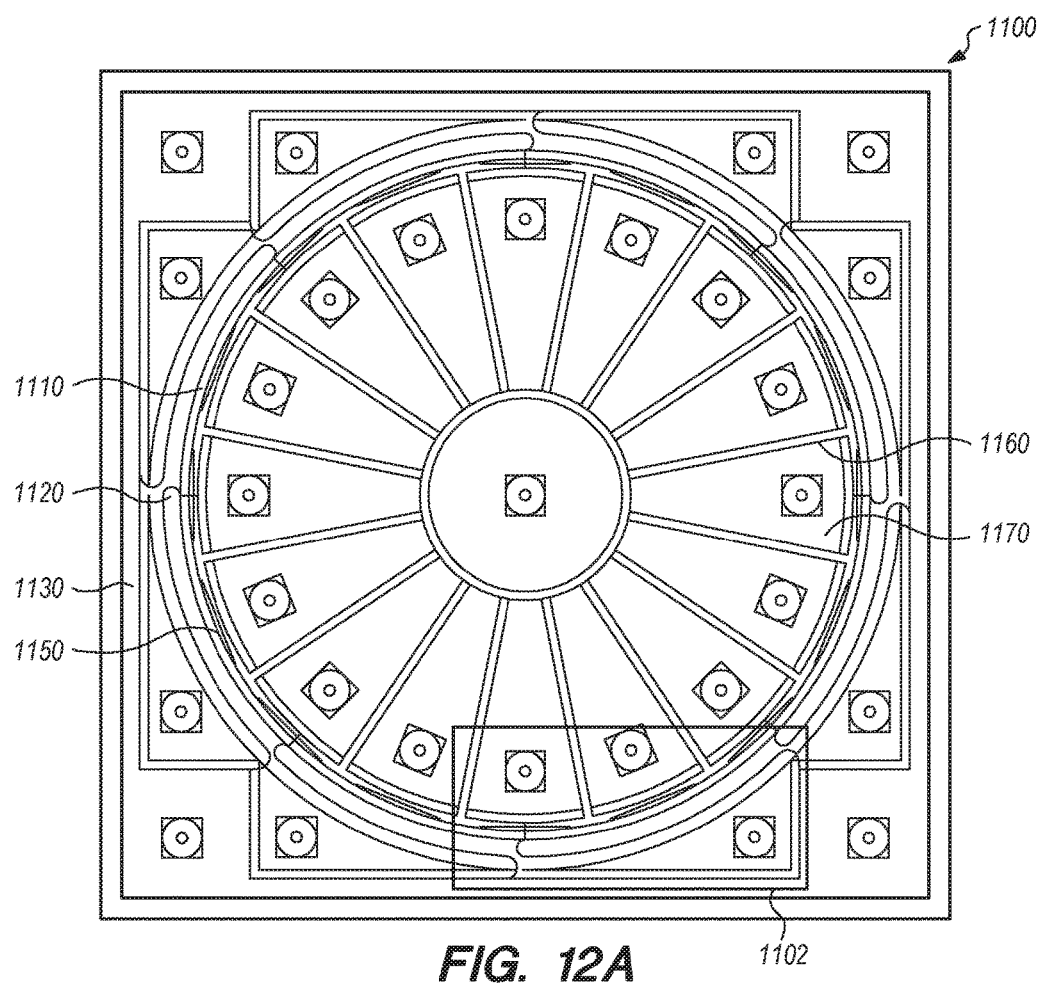
FIG. 12A shows a top-view diagram of another embodiment of a ring/disk resonant gyroscope in accordance with the Time Domain Switched Ring/Disc Resonant Gyroscope.
Figure 12B:
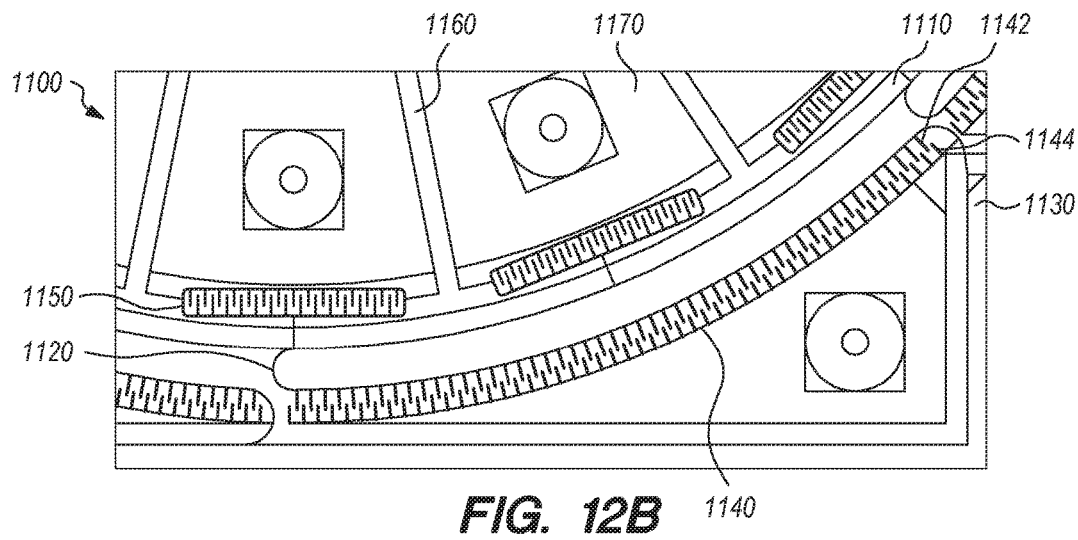
FIG. 12B shows a detailed diagram of an embodiment of a comb drive and capacitive proximity switch for use with a ring/disk resonator gyroscope in accordance with the Time Domain Switched Ring/Disc Resonant Gyroscope.

A drive mechanism, such as shown in FIG. 12B, is configured to induce the circular oscillator into a two-dimensional drive oscillation, such as the x and the y directions as shown in FIG. 1. The drive oscillation is modified responsive to a sense oscillation of the circular oscillator caused by an angular rotation of support frame 530 and circular oscillator 510.

Digital proximity switches 540 are disposed around a perimeter of circular oscillator 510. Specifically, gyroscope 500 includes sixteen capacitive-based digital proximity switches 540 that are evenly spaced around the perimeter of circular oscillator 510 and are secured to frame 530. Proximity switches 540 detect when circular oscillator 510 passes a known location. Particularly, proximity switches 540 detect when the oscillating outer perimeter of circular oscillator 510 passes a fixed $x_i$ and $y_i$ points (with i=1 to 16). These fixed $x_i$ and $y_i$ points are defined by design layout and fabrication. Fabrication tolerances can be compensated for by using (Eq. 1) to solve for $x_i$ and $y_i$ under zero acceleration and rotation conditions.

In some embodiments, digital proximity switches 540 include more than six digital proximity switches evenly distributed around the perimeter of circular oscillator 510. During operation, the amplitude of circular oscillator 510's oscillation is maintained a value where at least six switches activate per half oscillation, regardless of the rotation of the oscillation (by means of capacitive forcing). In some embodiments, at least six of digital proximity switches 540 are configured to switch between an open state and a closed state and generate a time and position output. The time and position output of the at least six digital proximity switches 540 allows for a determination of each of a plurality of variable oscillation parameters for each oscillation of the modified drive oscillation as defined by Equation 1.

During the modified drive oscillation a plurality of digital proximity switches 540 are configured to switch between an open state and a closed state and generate a time and position output to allow for a determination of each of a plurality of variable oscillation parameters for each oscillation of the modified drive oscillation. As an example, the switching of the proximity switches and the generation of the time and position in two dimensions output is the same as is described for time and position in one dimension in the commonly-assigned parent application, U.S. patent application Ser. No. 13/168,603 filed Jun. 24, 2011, entitled "Apparatus and Methods for Time Domain Measurement of Oscillation Perturbations", the content of which is fully incorporated by reference herein. It should be recognized that while the above-mentioned application used electron tunneling proximity switches, the examples presented here involve a threshold varying capacitance proximity switches. The mechanics of the switch may vary so as long as the switch transitions from low to high (or high to low) when the proof mass passes a fixed point.

As an example, digital proximity switches 540 may be sliding plane proximity switches that operate as is shown and disclosed in one or more of commonly-assigned patents U.S. Pat. No. 8,650,955 to Swanson et al., titled "Time Domain Switched Gyroscope" and U.S. Pat. No. 9,103,673 to Swanson et al., titled "Inertial Sensor Using Sliding Plane Proximity Switches," as well as the commonly-assigned parent application of the instant application, the content of each of which is fully incorporated by reference herein. The proximity switch can be any mechanism that provides a digital signal when part of the proof mass (ring/disk) passes a known location. As an example, the sliding plane devices may comprise 5 mm diameter rings, 40 microns wide, and 400 microns thick. The capacitive drive may comprise parallel plate capacitors. As an example, the proximity switch may comprise conductive proof masses passing over metal electrodes. In another embodiment, a device includes a diameter ring 4 microns wide and 40 microns thick with comb drives and comb proximity switch capacitors.

Figure 7:
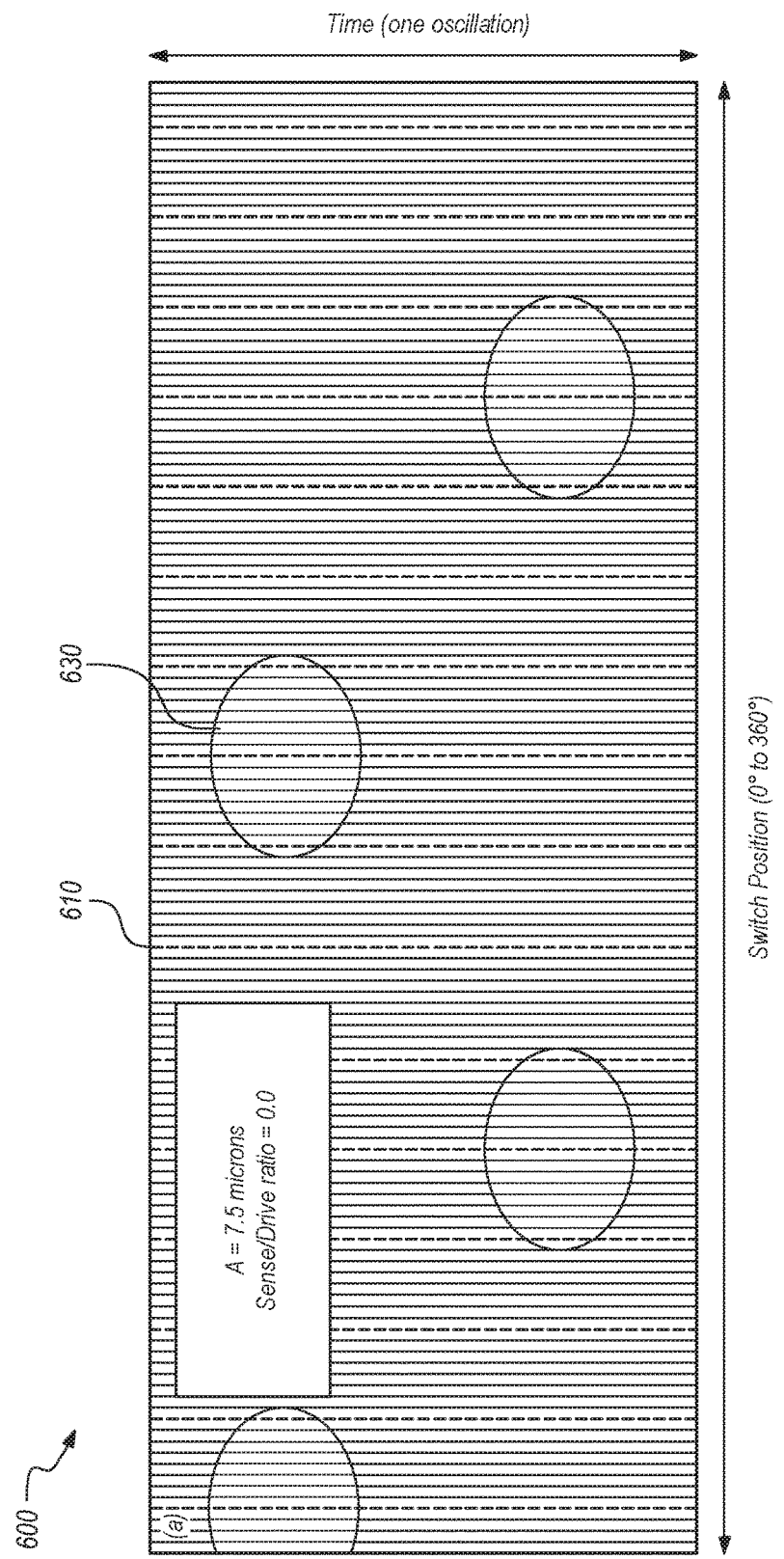
FIGS. 7-9 maps switch state over time for the angular position (0° to 360°) of the switch with respect to the main axis of the current oscillation of a ring/disk resonant gyroscope in accordance with the Time Domain Switched Ring/Disc Resonant Gyroscope.
Figure 8:
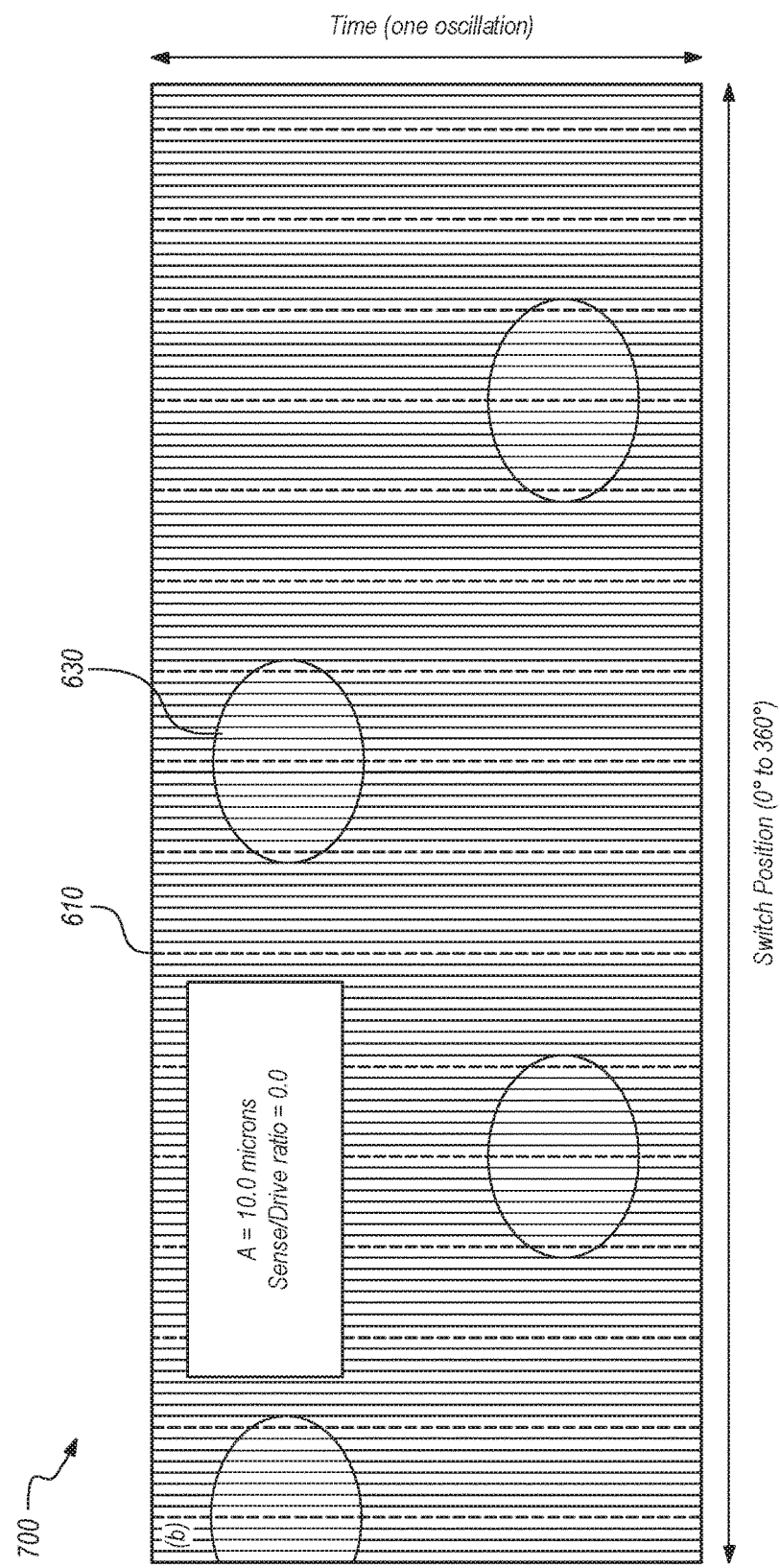
Figure 9:
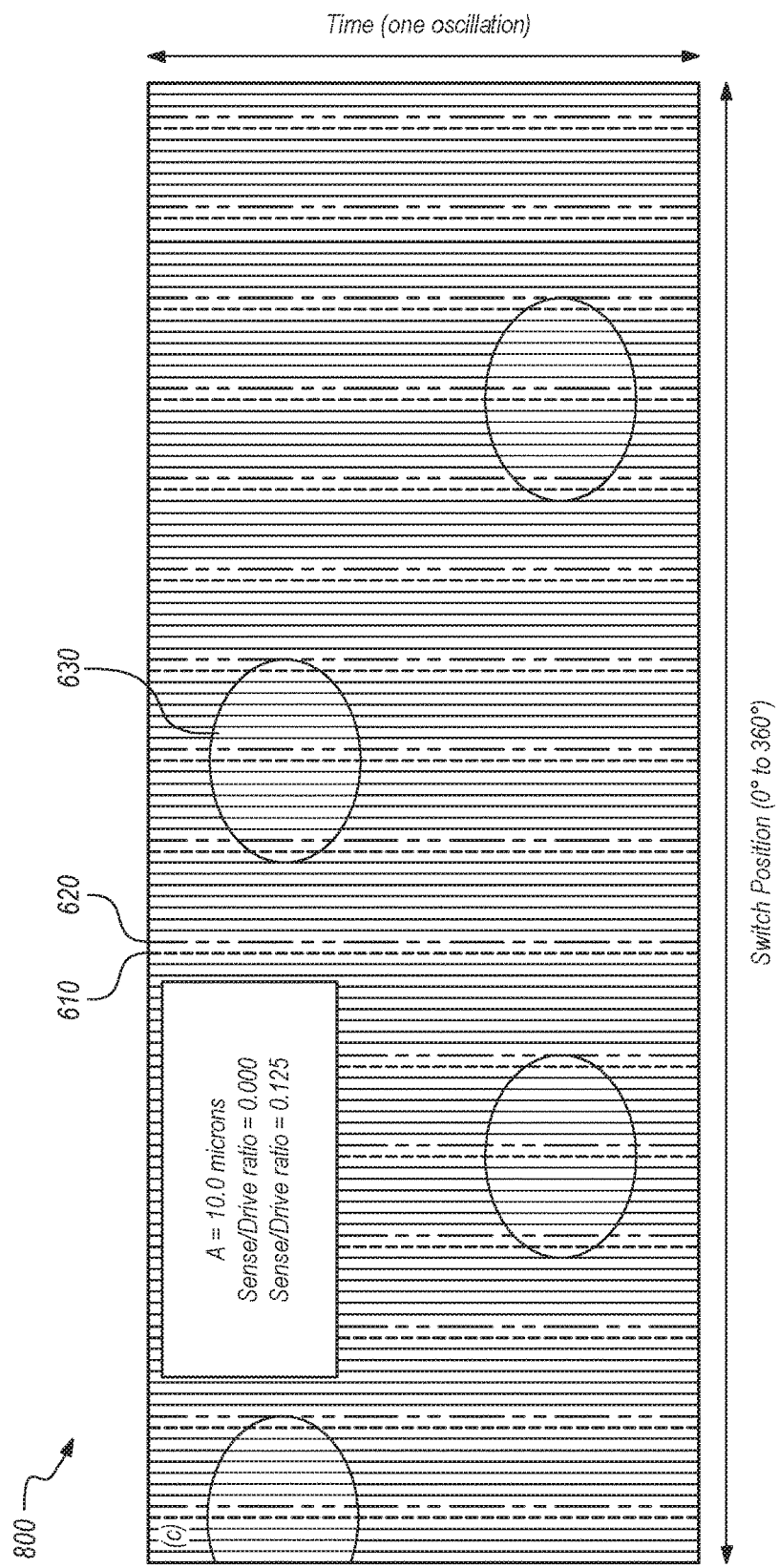

FIGS. 7-9 show angle versus time interval maps for a single oscillation period of an embodiment of a ring/disk resonant gyroscope in accordance with the Time Domain Switched Ring/Disc Resonant Gyroscope. FIG. 7 shows an angle versus time interval map 600 for a single oscillation period for an oscillation amplitude of 7.5 microns with a sense/drive ratio of zero, FIG. 8 shows a map 700 of an oscillation amplitude of 10 microns with a sense/drive ratio of zero, and FIG. 9 shows a map 800 of an oscillation amplitude of 10 microns with a sense/drive ratio of 0.125.

Switches are placed every 11.25°, 5 microns out from the 5 mm diameter ring perimeter, as shown in FIGS. 6A and 6B.

Changing the switch locations from lines 610 to lines 620 creates a "virtual" rotation of the ring oscillation relative to the switches. The oval regions 630 in FIGS. 7-9 map the regions of a 5 mm diameter oscillating ring that passes a distance of 5 microns beyond the original radius of the ring. Lines 610 represent the locations of the switches around the perimeter of the ring. The shift in the position of the switches for a given rotation in the vibrational mode is depicted by lines 620.

Figure 10:
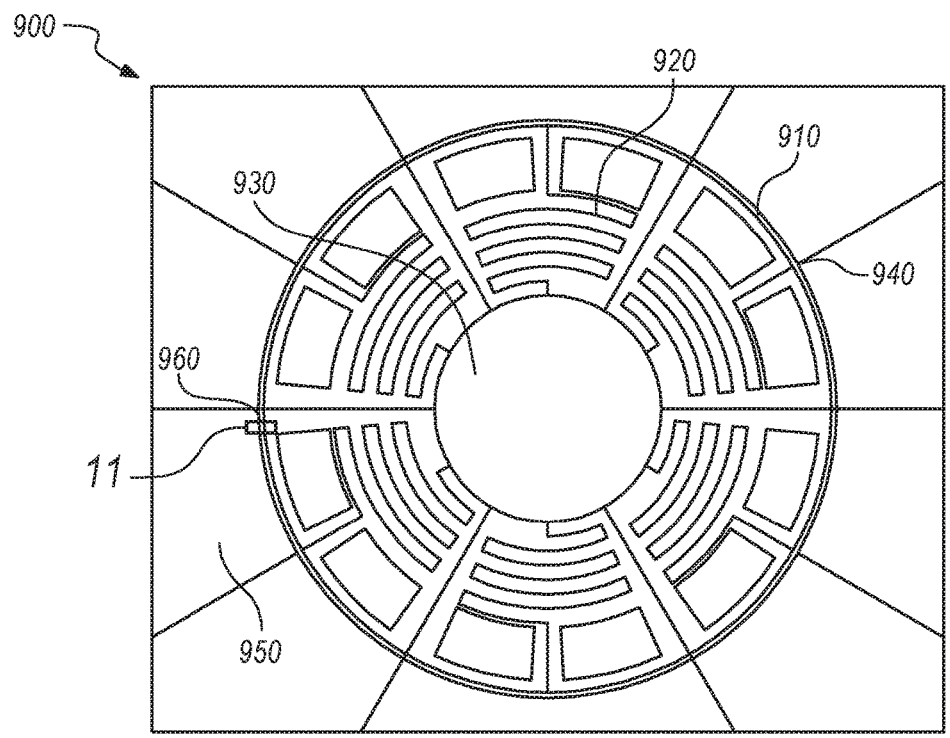
FIG. 10 shows a top-view diagram of another embodiment of a ring/disk resonant gyroscope in accordance with the Time Domain Switched Ring/Disc Resonant Gyroscope.

FIG. 10 shows a top-view diagram of another embodiment of a ring/disk resonant gyroscope 900 in accordance with the Time Domain Switched Ring/Disc Resonant Gyroscope. In the embodiment shown, gyroscope 900 includes a circular oscillator 910 suspended by a flexible support structure 920 to a central support frame 930, with support frame 930 being located central to circular oscillator 910. As an example, circular oscillator 910 may comprise a ring, disk, or other circular oscillator that is capable of two-dimensional oscillation as would be recognized by a person having ordinary skill in the art. As shown, flexible support structure 920 includes eight springs which are disposed around an inside perimeter of circular oscillator 910 between circular oscillator 910 and support frame 930.

A drive mechanism, such as shown in FIG. 12B, is configured to induce the circular oscillator into a two-dimensional drive oscillation. The drive oscillation is modified responsive to a sense oscillation of the circular oscillator caused by an angular rotation of support frame 930 and circular oscillator 910.

A plurality of digital proximity switches 940 is disposed around a perimeter of circular oscillator 910. Specifically, gyroscope 900 includes sixteen capacitive-based digital proximity switches 940 that are evenly spaced around the perimeter of circular oscillator 910. However, it should be recognized that switches 940 may have a spacing that is not evenly around perimeter of circular oscillator 910. As an example, digital proximity switches 940 may be configured similarly as digital proximity switches 540 shown in and discussed above with reference to FIGS. 6A and 6B. Gyroscope 900 further includes an external support frame 950 surrounding circular oscillator 910.

Figure 11:
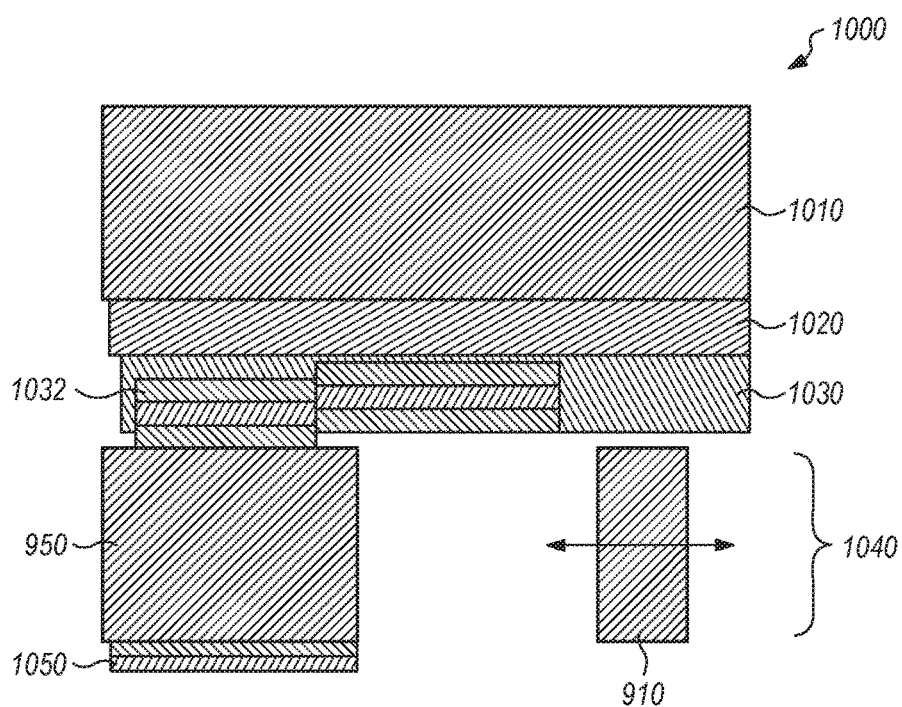
FIG. 11 shows a cross-section view of an embodiment of a MEMS-based ring/disk resonant gyroscope in accordance with the Time Domain Switched Ring/Disc Resonant Gyroscope.

FIG. 11 shows a cross-section view 1000 of the embodiment of a MEMS-based ring/disk resonant gyroscope 900 shown in FIG. 10, with the cross-section taken at box 960 shown in FIG. 10. Gyroscope 1000 includes a support handle wafer layer 1010, a $SiO_2$—$SiO_2$ bonding layer 1020, an AlO layer 1030 covering the sense electrode 1032, a metallization device layer 1040 that is bonded to handle wafer layer 1010, and an electrical contact metallization layer 1050 to serve as a contact for sense electrode 1032. Device layer 1040 includes circular oscillator 910, springs 920 (shown in FIG. 10), central support frame 930 (shown in FIG. 10), and external support frame 950.

Referring to FIGS. 12A and 12B, FIG. 12A shows a top-view diagram of another embodiment of a ring/disk resonant gyroscope 1100 in accordance with the Time Domain Switched Ring/Disc Resonant Gyroscope, while FIG. 12B shows a detailed diagram of a portion 1102 of gyroscope 1100 showing an embodiment of a comb drive and capacitive proximity switch. In the embodiment shown, gyroscope 1100 includes a circular oscillator 1110 suspended by a flexible support structure 1120 to a support frame 1130, with support frame 1130 being located external to circular oscillator 1110. As an example, circular oscillator 1110 may comprise a ring, disk, or other circular oscillator that is capable of two-dimensional oscillation as would be recognized by a person having ordinary skill in the art. As shown, flexible support structure 1120 includes eight springs which are disposed around an outside perimeter of circular oscillator 1110 between circular oscillator 1110 and support frame 1130. The particular "s" design of the springs allows for both in/out movement of circular oscillator 1110 as well as tilting of circular oscillator 1110. However, it should be recognized that other spring designs may be used that provide similar functionality.

A drive mechanism 1140, such as shown in FIG. 12B, is configured to induce the circular oscillator into a two-dimensional drive oscillation, such as the x and the y directions. The drive oscillation is modified responsive to a sense oscillation of the circular oscillator caused by an angular rotation of support frame 1130 and circular oscillator 1110. The sense oscillation is caused by the combination of the drive oscillation and the rotation of the support frame 1130. The current sense oscillation is added to the current drive oscillation to form a new drive oscillation.

As shown in FIG. 12A, the drive mechanism comprises more than one comb drives 1140 disposed around an outside perimeter of circular oscillator 1110. As shown in FIG. 12B, each comb drive may comprise a first set of fingers 1142 integrated into flexible support structure 1120 and coupled to circular oscillator 1110. Comb drive 1140 further includes a second set of fingers 1144 coupled to an external support frame 1130. It should be noted that fingers 1142 and 1144 are always interlocked during operation of gyroscope 1100.

FIG. 12B also shows a plurality of digital proximity switches 1150 (e.g. threshold capacitive switches) disposed adjacent to circular oscillator 1110 and around the inside perimeter of circular oscillator 1110. It should be noted that the two sets of fingers of switches 1150 are open (i.e. not initially interlocked), but become interlocked based upon a sufficient movement of circular oscillator 1110, at which point the switches are closed and an output voltage is generated. Lines 1160 in FIGS. 12A and 12B represent etched areas that provide for isolated sections 1170 of gyroscope 1100.

Figure 13:
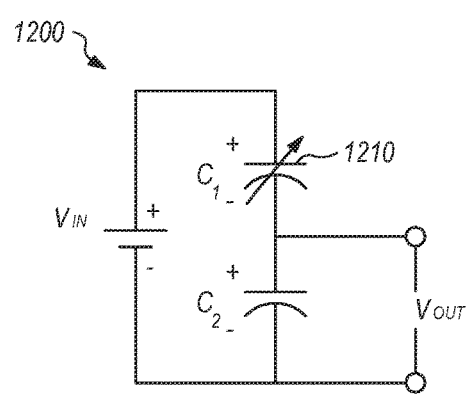
FIG. 13 shows a diagram of a capacitive voltage divider circuit that may be used with an embodiment of a ring/disk resonator gyroscope in accordance with the Time Domain Switched Ring/Disc Resonant Gyroscope.

FIG. 13 shows a diagram of a capacitive voltage divider circuit 1200 that may be used with the thresholding position sensing variable capacitors connected to a ring/disk resonator gyroscope in accordance with the Time Domain Switched Ring/Disc Resonant Gyroscope. One of the capacitors 1210 in the circuit is variable based on whether or not the proof mass is passing a given position, as shown in the graphs depicting the accumulated charge in FIGS. 14A and 14B. As an example, circuit 1200 may be used in processor 1630 as shown in FIG. 17.

Figure 14A:
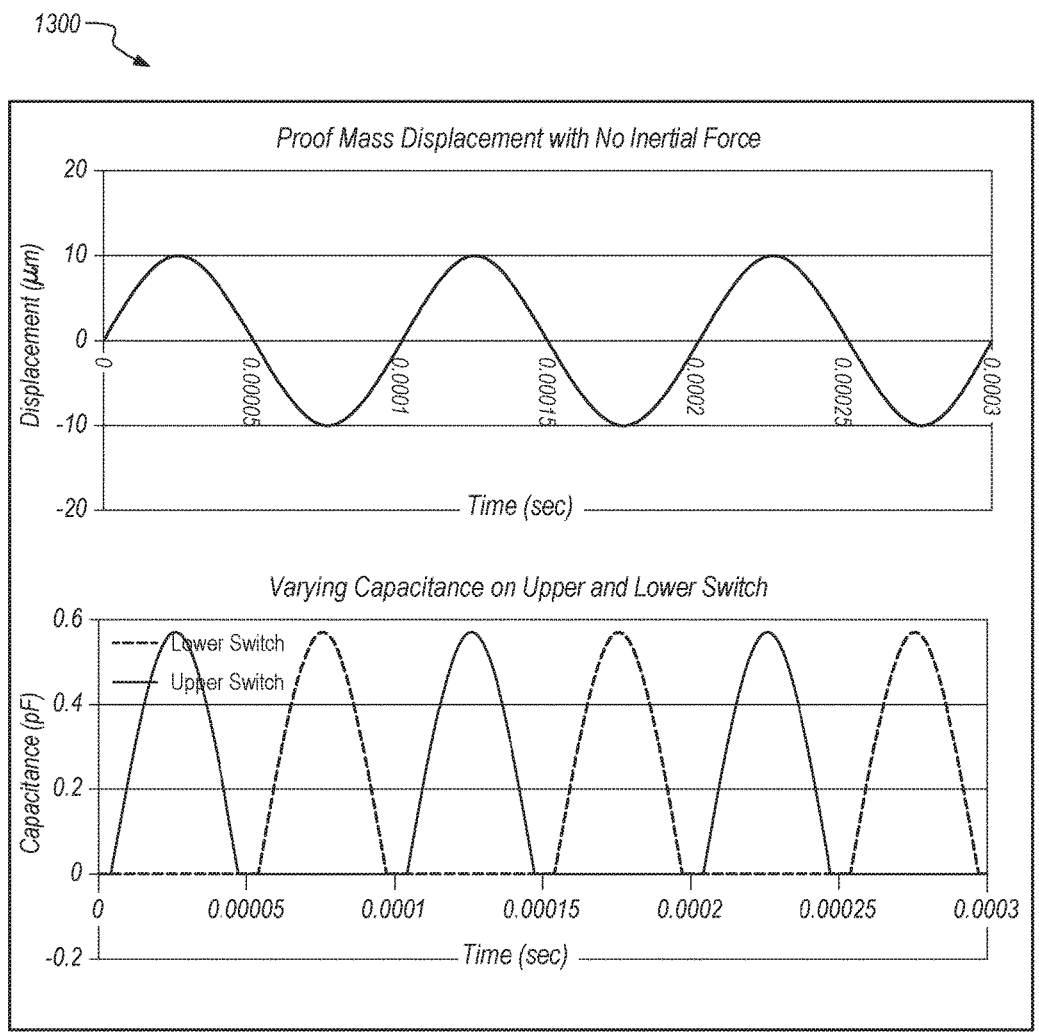
FIGS. 14A and 14B show graphs illustrating proximity switch displacement with and without inertial forces and corresponding varying capacitance on the proximity switch.
Figure 14B:
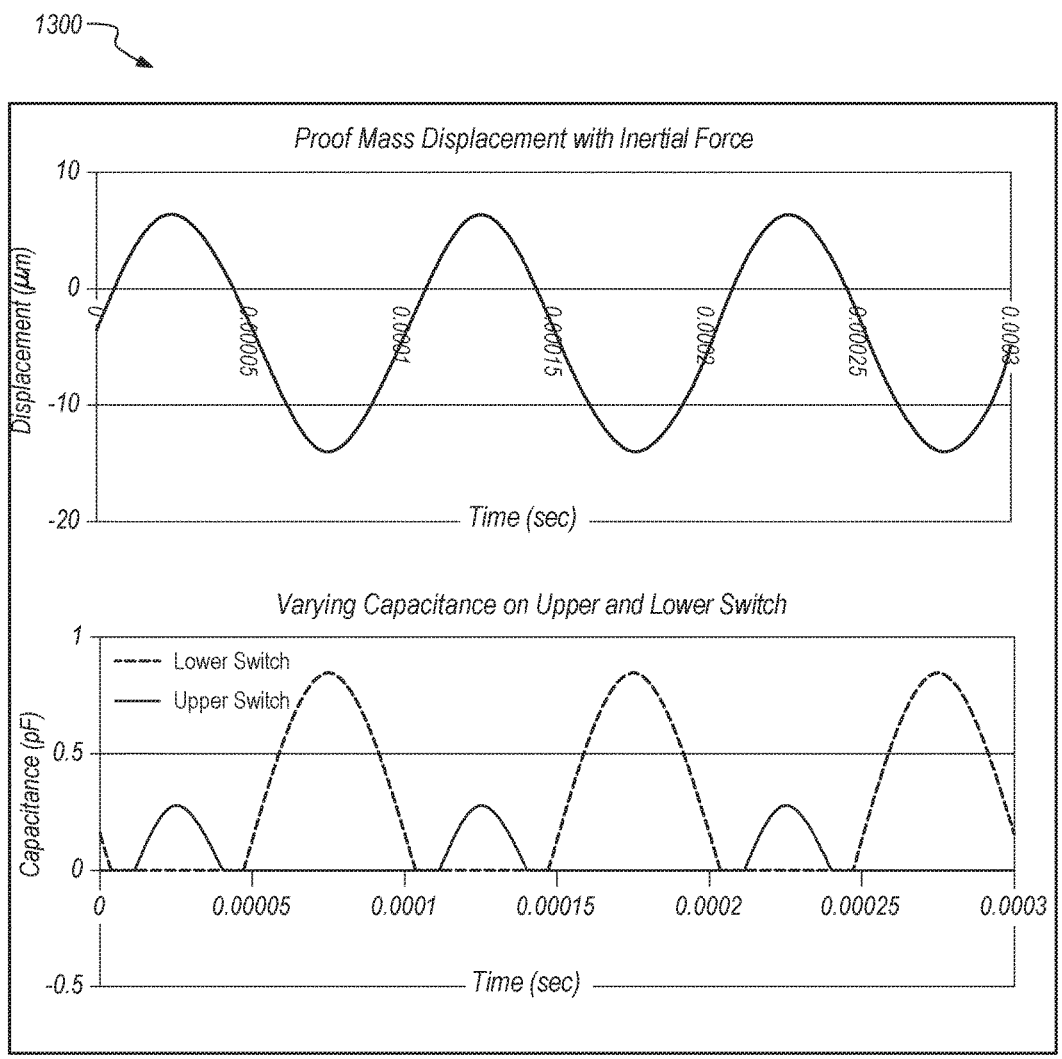

FIGS. 14A and 14B show graphs 1300 illustrating proximity switch displacement with and without inertial forces and corresponding varying capacitance on the proximity switch. FIGS. 14A and 14B show that the signal on the capacitor thresholds when the proof mass passes the sense electrode, where the oscillation amplitudes are different for FIGS. 14A and 14B. Upper switch and lower switches represent switches at 90 degrees to each other.

Figure 15:
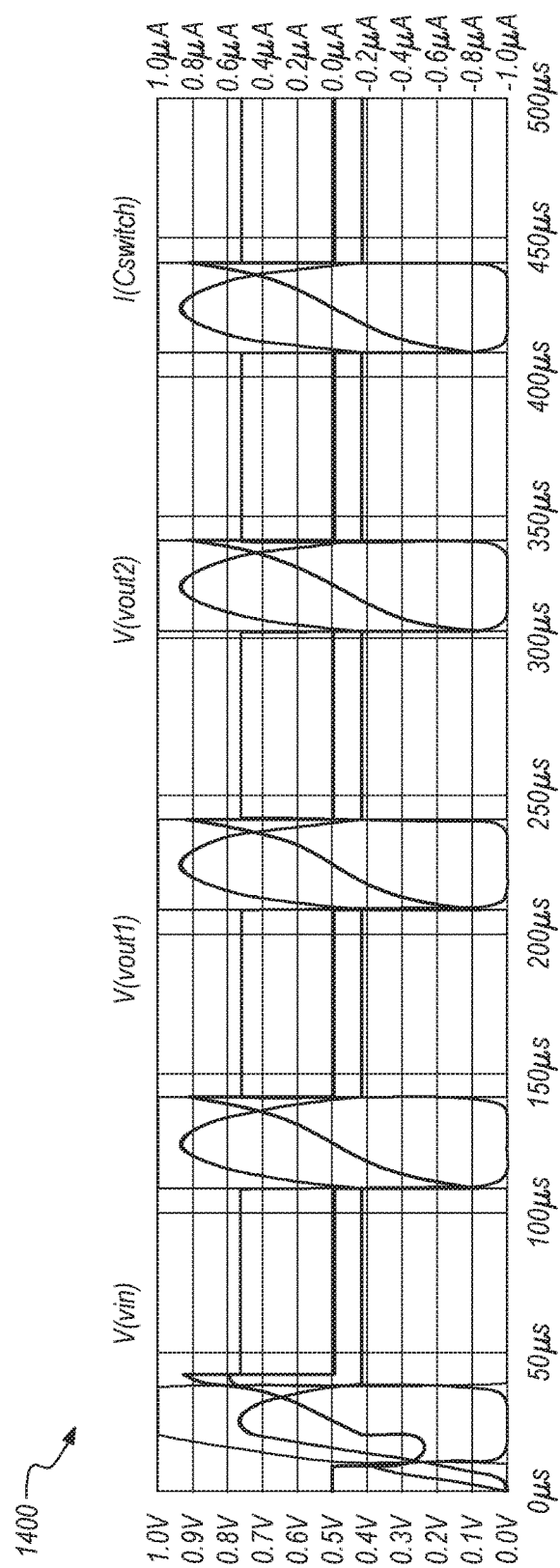
FIG. 15 shows a graph illustrating signal conditioning out of a proximity switch using a hair trigger digital inverter.

FIG. 15 shows a graph 1400 illustrating signal conditioning out of a proximity switch using a hair trigger digital inverter. The inverter ties the floating output of the capacitive voltage divider to the low state of the inverter and switches the inverter as soon as charge builds up on the variable capacitor. The graph shows the signals at different locations in the circuit shown in FIG. 16.

Figure 16:
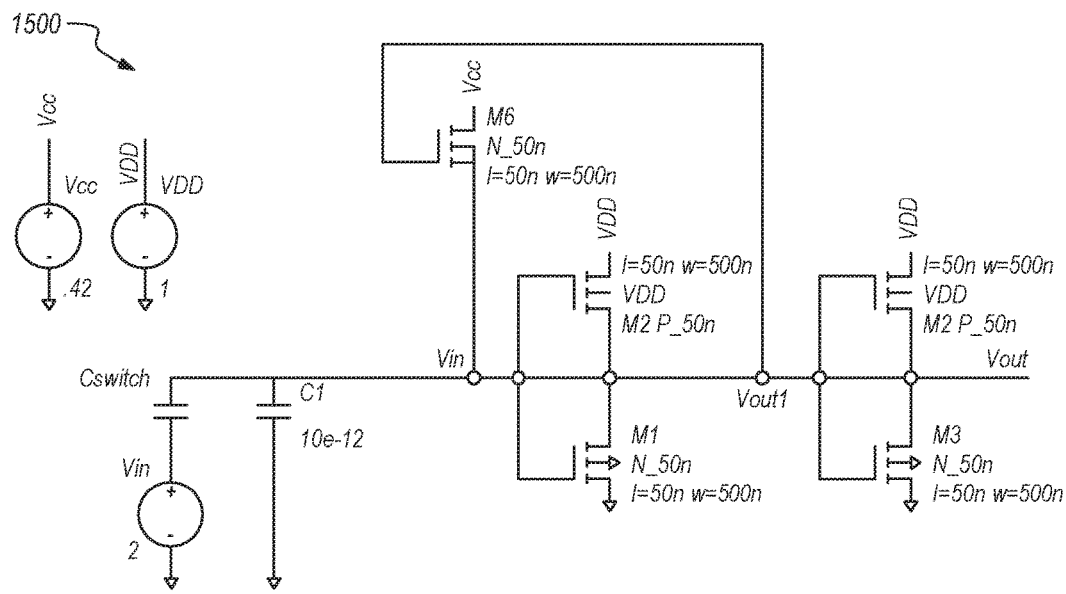
FIG. 16 shows a circuit diagram of a digital trigger that may be used with an embodiment of a ring/disk resonator gyroscope in accordance with the Time Domain Switched Ring/Disc Resonant Gyroscope.

FIG. 16 shows a circuit diagram of a digital trigger 1500 that may be used with an embodiment of a ring/disk resonator gyroscope in accordance with the Time Domain Switched Ring/Disc Resonant Gyroscope. As an example, a TDC was programmed onto a Xilinx Spartan 6 FPGA with a 100 MHz clock. The TDC is a basic delay-line based TDC, programmed as a chain of CARRY4 elements with corresponding FDRE elements for saving to memory. In some embodiments, other TDCs such as looped TDCs or hierarchical TDCs may be used. In the delay-line based TDC, the resolution is primarily capped by the maximum number of delay elements that the FPGA can implement. As an example, circuit 1200 may be used between sensor system 1610 and time to digital converter 1620 as shown in FIG. 17.

FIG. 17 shows a block diagram of an embodiment of a system 1600 in accordance with the Time Domain Switched Ring/Disc Resonant Gyroscope. System 1600 includes a sensor system 1610 such as shown and described with reference to, for example, in FIGS. 6A, 6B, 10 11, 12A, and 12B herein. System 1600 further includes a digital to time converter 1620 configured to convert the time and position output of the proximity switches of sensor system 1610 to time intervals. System 1600 further includes a processor 1630 configured to use the time intervals received from converter 1620 to determine the angular rotation of the support frame and the circular oscillator of sensor system 1610. As an example, processor 1630 may use pipeline processing to ensure all data is analyzed regardless of the amount of time required to collect all of the data.

Various elements of the Time Domain Switched Ring/Disc Resonant Gyroscope may be implemented with one or more application specific integrated circuits (ASICs), digital signal processors (DSPs), digital signal processing devices (DSPDs), programmable logic devices (PLDs), field programmable gate arrays (FPGAs), controllers, micro-controllers, microprocessors, electronic devices, other electronic units, or a combination thereof.

Many modifications and variations of the Time Domain Switched Ring/Disc Resonant Gyroscope are possible in light of the above description. The scope of the claims is not limited to the implementations and embodiments disclosed herein, but extends to other implementations and embodiments as may be contemplated by those having ordinary skill in the art.

We claim:

1. A system comprising:
 a circular oscillator suspended by a flexible support structure to a support frame;
 a drive mechanism configured to induce the circular oscillator into a two-dimensional drive oscillation, wherein the drive oscillation is modified responsive to a sense oscillation of the circular oscillator caused by an angular rotation of the support frame and the circular oscillator; and
 a plurality of digital proximity switches, disposed around a perimeter of the circular oscillator, wherein during the modified drive oscillation a plurality of the digital proximity switches switch between an open state and a closed state and generate a time and position output; and
 a processor configured to use a digital to time converter to convert the time and position output to time intervals between the triggering of the digital proximity switches, the processor further configured to use the time intervals between the triggering of the digital proximity switches to determine the angular rotation of the support frame and the circular oscillator by using harmonic oscillator equations to derive the ratio between the drive oscillation and the modified drive oscillation.

2. The system of claim 1, wherein the plurality of digital proximity switches are disposed around an inside perimeter of the circular oscillator.

3. The system of claim 1, wherein the support frame is located central to the circular oscillator, wherein the flexible support structure comprises a plurality of springs disposed around an inside perimeter of the circular oscillator between the circular oscillator and the support frame.

4. The system of claim 1, wherein the circular oscillator is a ring.

5. The system of claim 1, wherein the circular oscillator is a disk.

6. The system of claim 1, wherein the drive mechanism comprises more than one comb drives disposed around an outside perimeter of the circular oscillator.

7. The system of claim 6, wherein each of the comb drives comprise a first set of fingers coupled to the circular oscillator and a second set of fingers coupled to an external support structure.

8. The system of claim 1, wherein the digital proximity switches are capacitive-based proximity switches.

9. The system of claim 1, wherein the plurality of digital proximity switches comprises more than six digital proximity switches evenly distributed around the perimeter of the circular oscillator.

10. The system of claim 9, wherein at least six of the more than six digital proximity switches are configured to switch between an open state and a closed state and generate a time and position output.

11. The system of claim 10, wherein the time and position output of the at least six digital proximity switches allows for a determination of each of a plurality of variable oscillation parameters for each oscillation of the modified drive oscillation as defined by the equation $$\frac{[(x-X_o)\cos(\Delta)+(y-Y_o)\sin(\Delta)]^2}{\left[R+A\cos\left(\frac{2\pi t}{P}\right)e^{-at}\right]^2}+\frac{[(x-X_o)\sin(\Delta)-(y-Y_o)\cos(\Delta)]^2}{\left[R-A\cos\left(\frac{2\pi t}{P}\right)e^{-at}\right]^2}=1.$$

12. A system comprising:
 a circular oscillator suspended by a flexible support structure to a support frame;
 a drive mechanism configured to induce the circular oscillator into a two-dimensional drive oscillation, wherein the drive oscillation is modified responsive to a sense oscillation of the circular oscillator caused by an angular rotation of the support frame and the circular oscillator;
 a plurality of digital proximity switches, disposed around a perimeter of the circular oscillator, wherein during the modified drive oscillation a plurality of the digital proximity switches switch between an open state and a closed state and generate a time and position output to allow for a determination of each of a plurality of variable oscillation parameters for each oscillation of the modified drive oscillation, wherein the plurality of digital proximity switches comprises more than six digital proximity switches evenly distributed around the perimeter of the circular oscillator; and a processor configured to use a digital to time converter to convert the time and position output to time intervals between the triggering of the digital proximity switches, the processor further configured to use the time intervals between the triggering of the digital proximity switches to determine the angular rotation of the support frame and the circular oscillator by using harmonic oscillator equations to derive the ratio between the drive oscillation and the modified drive oscillation.

13. The system of claim 12, wherein the support frame is located central to the circular oscillator, wherein the flexible support structure comprises a plurality of springs disposed around an inside perimeter of the circular oscillator between the circular oscillator and the support frame.

14. The system of claim 12, wherein the circular oscillator is a ring.

15. The system of claim 12, wherein the circular oscillator is a disk.

16. The system of claim 12, wherein the drive mechanism comprises more than one comb drives disposed around an outside perimeter of the circular oscillator.

17. The system of claim 16, wherein each of the comb drives comprise a first set of fingers coupled to the circular oscillator and a second set of fingers coupled to an external support structure.

18. The system of claim 12, wherein at least six of the more than six digital proximity switches are configured to switch between an open state and a closed state and generate a time and position output, wherein the time and position output of the at least six digital proximity switches allows for a determination of each of a plurality of variable oscillation parameters for each oscillation of the modified drive oscillation as defined by the equation $$\frac{[(x-X_o)\cos(\Delta) + (y-Y_o)\sin(\Delta)]^2}{\left[R + A\cos\left(\frac{2\pi t}{P}\right)e^{-\alpha t}\right]^2} + \frac{[(x-X_o)\sin(\Delta) - (y-Y_o)\cos(\Delta)]^2}{\left[R - A\cos\left(\frac{2\pi t}{P}\right)e^{-\alpha t}\right]^2}$$

19. A system comprising:
a circular oscillator suspended by a flexible support structure to a support frame, wherein the circular oscillator is one of a ring and a disk;
a drive mechanism configured to induce the circular oscillator into a two-dimensional drive oscillation, wherein the drive oscillation is modified responsive to a sense oscillation of the circular oscillator caused by an angular rotation of the support frame and the circular oscillator;
a plurality of capacitive-based digital proximity switches, disposed around a perimeter of the circular oscillator, wherein during the modified drive oscillation a plurality of the digital proximity switches switch between an open state and a closed state and generate a time and position output to allow for a determination of each of a plurality of variable oscillation parameters for each oscillation of the modified drive oscillation, wherein the plurality of digital proximity switches comprises more than six digital proximity switches evenly distributed around the perimeter of the circular oscillator, wherein at least six of the digital proximity switches are configured to switch between an open state and a closed state and generate a time and position output; and
a processor configured to use a digital to time converter to convert the time and position output to time intervals between the triggering of the digital proximity switches, the processor further configured to use the time intervals between the triggering of the digital proximity switches to determine the angular rotation of the support frame and the circular oscillator by using harmonic oscillator equations to derive the ratio between the drive oscillation and the modified drive oscillation.

* * * * *